United States Patent
S et al.

(10) Patent No.: US 11,704,461 B1
(45) Date of Patent: Jul. 18, 2023

(54) DYNAMIC CONTROL OF COVERAGE BY A VERIFICATION TESTBENCH

(71) Applicant: International Business Machines Corporation, Armonk, NY (US)

(72) Inventors: Swathi Priya S, Banglore (IN); Sandeep Korrapati, Bangalore (IN); Pretty Mariam Jacob, Bangalore (IN); Anusha Reddy Rangareddygari, Bangalore (IN); Puli Srivani, Hyderabad (IN); sreekanth reddy Kadapala, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 17/567,977

(22) Filed: Jan. 4, 2022

(51) Int. Cl.
*G06F 30/3308* (2020.01)
*G06F 30/20* (2020.01)
*G06F 30/398* (2020.01)

(52) U.S. Cl.
CPC .......... *G06F 30/3308* (2020.01); *G06F 30/20* (2020.01); *G06F 30/398* (2020.01)

(58) Field of Classification Search
CPC ..... G06F 30/3308; G06F 30/398; G06F 30/20
USPC ........................... 716/106, 111, 136; 703/16
See application file for complete search history.

(56) References Cited

U.S. PATENT DOCUMENTS

| | | | | |
|---|---|---|---|---|
| 6,269,467 B1 * | 7/2001 | Chang | G06F 30/33 | 716/136 |
| 6,539,523 B1 * | 3/2003 | Narain | G06F 30/33 | 716/106 |
| 6,557,150 B1 * | 4/2003 | Honmura | G06F 30/33 | 716/113 |
| 6,571,375 B1 * | 5/2003 | Narain | G06F 30/33 | 716/106 |
| 6,581,191 B1 * | 6/2003 | Schubert | G01R 31/318364 | 716/136 |
| 6,651,228 B1 * | 11/2003 | Narain | G06F 30/33 | 716/106 |
| 6,931,572 B1 * | 8/2005 | Schubert | G01R 31/31705 | 714/34 |
| 7,072,818 B1 * | 7/2006 | Beardslee | G01R 31/318357 | 716/102 |

(Continued)

OTHER PUBLICATIONS

Cummings, "Applying Stimulus & Sampling Outputs—UVM Verification Testing Techniques", Sunburst Design, Inc., http://www.sunburst-design.com/papers/CummingsSNUG2016AUS_VerificationTimingTesting.pdf, 2016, 28 pages. (Year: 2016).*

*Primary Examiner* — Phallaka Kik
(74) *Attorney, Agent, or Firm* — Cantor Colburn LLP; Teddi Maranzano (57) ABSTRACT

Embodiments include dynamic control of coverage by a verification testbench. Aspects include obtaining a design under test to be verified by the verification testbench and obtaining one or more testcases for execution by the verification testbench on the design under test. Aspects also include obtaining a plurality of triggers corresponding to the design under test, wherein each of the plurality of triggers includes an activation condition, a deactivation condition and a coverage. Aspects further include simulating, by the verification testbench, execution of the one or more testcases by the design under test. Based on detecting the activation condition of one of the plurality of triggers, aspects also include recording, in a coverage database, data specified in the coverage corresponding the one of the plurality of triggers until the deactivation condition is detected.

20 Claims, 6 Drawing Sheets

(56) References Cited

U.S. PATENT DOCUMENTS

| | | | | |
|---|---|---|---|---|
| 7,240,303 B1* | 7/2007 | Schubert | G06F 30/33 | 703/15 |
| 7,827,510 B1* | 11/2010 | Schubert | G06F 30/331 | 716/111 |
| 8,522,190 B1* | 8/2013 | Sanghani | G01R 31/318552 | 716/108 |
| 9,934,342 B1* | 4/2018 | Huang | G06F 30/3323 | |
| 11,055,458 B1 | 7/2021 | Suresh et al. | | |
| 11,250,191 B1* | 2/2022 | Bachchu | G06F 30/327 | |
| 2002/0073380 A1* | 6/2002 | Cooke | G06F 30/30 | 716/102 |
| 2002/0184560 A1* | 12/2002 | Wang | G01R 31/31704 | 714/25 |
| 2003/0033591 A1* | 2/2003 | Fournier | G06F 11/3676 | 717/124 |
| 2003/0069724 A1* | 4/2003 | Schubert | G01R 31/318357 | 703/16 |
| 2003/0131325 A1* | 7/2003 | Schubert | G06F 30/33 | 716/106 |
| 2005/0010880 A1* | 1/2005 | Schubert | G01R 31/31705 | 716/106 |
| 2006/0025980 A1* | 2/2006 | Farago | G06F 30/33 | 703/17 |
| 2006/0075367 A1* | 4/2006 | Chan | G01R 31/318314 | 716/108 |
| 2008/0147372 A1* | 6/2008 | Paulsen | G06F 30/33 | 703/14 |
| 2009/0006066 A1* | 1/2009 | Behm | G06F 30/33 | 703/15 |
| 2009/0150838 A1* | 6/2009 | Huang | G06F 30/331 | 716/106 |
| 2015/0213169 A1 | 7/2015 | Meyer | | |
| 2019/0121932 A1 | 4/2019 | Saunders | | |
| 2019/0251219 A1 | 8/2019 | Behrend et al. | | |
| 2020/0218958 A1* | 7/2020 | Li | G06F 30/33 | |
| 2021/0357232 A1* | 11/2021 | Sun | G06F 30/337 | |

\* cited by examiner

DYNAMIC CONTROL OF COVERAGE BY A VERIFICATION TESTBENCH

BACKGROUND

The present invention generally relates to computer systems, and more specifically, to computer systems, computer-implemented methods, and computer program products for dynamically controlling the coverage of a verification testbench.

In the context of hardware and software systems, verification is the act of testing the performance of a design under test (DUT) by simulating the execution of one or more test cases. The coverage of the simulation refers to the performance data that is collected and stored during the simulation. Verification of complex computer systems often involves test cases that are configured to run for an extended duration, such as multiple days or weeks. Such simulations will generate a large amount of performance data, which makes the task of analyzing the performance data difficult and time-consuming. Accordingly, methods and systems for controlling the coverage for such long-duration verifications are needed.

SUMMARY

Embodiments of the present invention are directed to dynamic control of coverage by a verification testbench. A non-limiting example of the computer-implemented method includes obtaining a design under test to be verified by the verification testbench and one or more testcases for execution by the verification testbench on the design under test. The method also includes obtaining a plurality of triggers corresponding to the design under test, wherein each of the plurality of triggers includes an activation condition, a deactivation condition, and a coverage. The method further includes simulating, by the verification testbench, execution of the one or more testcases by the design under test. based on detecting the activation condition of one of the plurality of triggers, the method includes recording, in a coverage database, data specified in the coverage corresponding the one of the plurality of triggers until the deactivation condition is detected.

Embodiments of the present invention are directed to a system for dynamic control of coverage by a verification testbench. The system includes a memory having computer readable instructions and one or more processors for executing the computer readable instructions, the computer readable instructions controlling the one or more processors to perform operations including obtaining a design under test to be verified by the verification testbench and one or more testcases for execution by the verification testbench on the design under test. The operations also include obtaining a plurality of triggers corresponding to the design under test, wherein each of the plurality of triggers includes an activation condition, a deactivation condition, and a coverage. The operations further include simulating, by the verification testbench, execution of the one or more testcases by the design under test. based on detecting the activation condition of one of the plurality of triggers, the operations include recording, in a coverage database, data specified in the coverage corresponding the one of the plurality of triggers until the deactivation condition is detected.

Embodiments of the present invention are directed to a computer readable storage medium having program instructions embodied therewith, the program instructions executable by a processor to cause the processor to perform operations including obtaining a design under test to be verified by the verification testbench and one or more testcases for execution by the verification testbench on the design under test. The operations also include obtaining a plurality of triggers corresponding to the design under test, wherein each of the plurality of triggers includes an activation condition, a deactivation condition, and a coverage. The operations further include simulating, by the verification testbench, execution of the one or more testcases by the design under test. based on detecting the activation condition of one of the plurality of triggers, the operations include recording, in a coverage database, data specified in the coverage corresponding the one of the plurality of triggers until the deactivation condition is detected.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

One or more embodiments of the invention are configured to dynamically control a coverage of a verification testbench simulation of a design-under-test. In exemplary embodiments, the verification testbench includes a plurality of triggers, which are used to selectively enable/disable a coverage dynamically during the runtime of the simulation. Each of the triggers includes one or more resources that are monitored and a definition of a corresponding coverage that is enabled/disabled based on the monitored resources meeting an enable/disable condition. In exemplary embodiments, the resources are variables/states of the verification testbench and/or the design under test. Resources can include, but are not limited to, a voltage, a clock, initialization of a state of design, the occurrence of a particular activity, such as a boot, runtime, standby etc. In exemplary embodiments, the monitored resources are driven by triggers expressed in verification code, as a result, a single resource can be used directly as a low-level trigger and more than one resource can be combined to define a high-level trigger.

Figure 1:
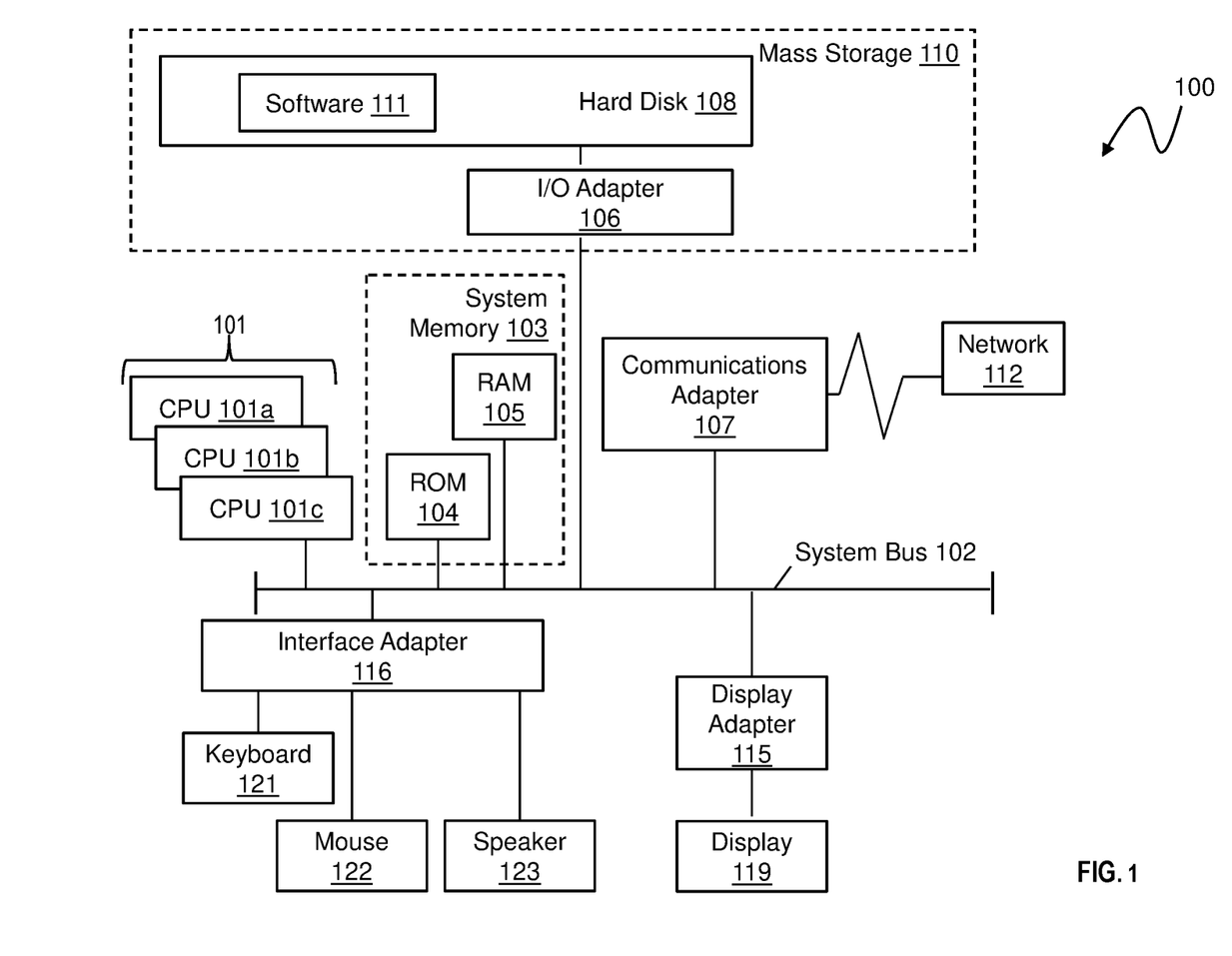
FIG. 1 depicts a block diagram of an example computer system for use in conjunction with one or more embodiments of the present invention.

Turning now to FIG. 1, a computer system 100 is generally shown in accordance with one or more embodiments of the invention. The computer system 100 can be an electronic, computer framework comprising and/or employing any number and combination of computing devices and networks utilizing various communication technologies, as described herein. The computer system 100 can be easily scalable, extensible, and modular, with the ability to change to different services or reconfigure some features independently of others. The computer system 100 may be, for example, a server, desktop computer, laptop computer, tablet computer, or smartphone. In some examples, computer system 100 may be a cloud computing node. Computer system 100 may be described in the general context of computer system executable instructions, such as program modules, being executed by a computer system. Generally, program modules may include routines, programs, objects, components, logic, data structures, and so on that perform particular tasks or implement particular abstract data types. Computer system 100 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, the computer system 100 has one or more central processing units (CPU(s)) 101a, 101b, 101c, etc., (collectively or generically referred to as processor(s) 101). The processors 101 can be a single-core processor, multi-core processor, computing cluster, or any number of other configurations. The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and may include a basic input/output system (BIOS) or its successors like Unified Extensible Firmware Interface (UEFI), which controls certain basic functions of the computer system 100. The RAM is read-write memory coupled to the system bus 102 for use by the processors 101. The system memory 103 provides temporary memory space for operations of said instructions during operation. The system memory 103 can include random access memory (RAM), read only memory, flash memory, or any other suitable memory systems.

The computer system 100 comprises an input/output (I/O) adapter 106 and a communications adapter 107 coupled to the system bus 102. The I/O adapter 106 may be a small computer system interface (SCSI) adapter that communicates with a hard disk 108 and/or any other similar component. The I/O adapter 106 and the hard disk 108 are collectively referred to herein as a mass storage 110.

Software 111 for execution on the computer system 100 may be stored in the mass storage 110. The mass storage 110 is an example of a tangible storage medium readable by the processors 101, where the software 111 is stored as instructions for execution by the processors 101 to cause the computer system 100 to operate, such as is described herein below with respect to the various Figures. Examples of computer program product and the execution of such instruction is discussed herein in more detail. The communications adapter 107 interconnects the system bus 102 with a network 112, which may be an outside network, enabling the computer system 100 to communicate with other such systems. In one embodiment, a portion of the system memory 103 and the mass storage 110 collectively store an operating system, which may be any appropriate operating system to coordinate the functions of the various components shown in FIG. 1.

Additional input/output devices are shown as connected to the system bus 102 via a display adapter 115 and an interface adapter 116. In one embodiment, the adapters 106, 107, 115, and 116 may be connected to one or more I/O buses that are connected to the system bus 102 via an intermediate bus bridge (not shown). A display 119 (e.g., a screen or a display monitor) is connected to the system bus 102 by the display adapter 115, which may include a graphics controller to improve the performance of graphics intensive applications and a video controller. A keyboard 121, a mouse 122, a speaker 123, etc., can be interconnected to the system bus 102 via the interface adapter 116, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI) and the Peripheral Component Interconnect Express (PCIe). Thus, as configured in FIG. 1, the computer system 100 includes processing capability in the form of the processors 101, and, storage capability including the system memory 103 and the mass storage 110, input means such as the keyboard 121 and the mouse 122, and output capability including the speaker 123 and the display 119.

In some embodiments, the communications adapter 107 can transmit data using any suitable interface or protocol, such as the internet small computer system interface, among others. The network 112 may be a cellular network, a radio network, a wide area network (WAN), a local area network (LAN), or the Internet, among others. An external computing device may connect to the computer system 100 through the network 112. In some examples, an external computing device may be an external webserver or a cloud computing node.

It is to be understood that the block diagram of FIG. 1 is not intended to indicate that the computer system 100 is to include all of the components shown in FIG. 1. Rather, the computer system 100 can include any appropriate fewer or additional components not illustrated in FIG. 1 (e.g., additional memory components, embedded controllers, modules, additional network interfaces, etc.). Further, the embodiments described herein with respect to computer system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
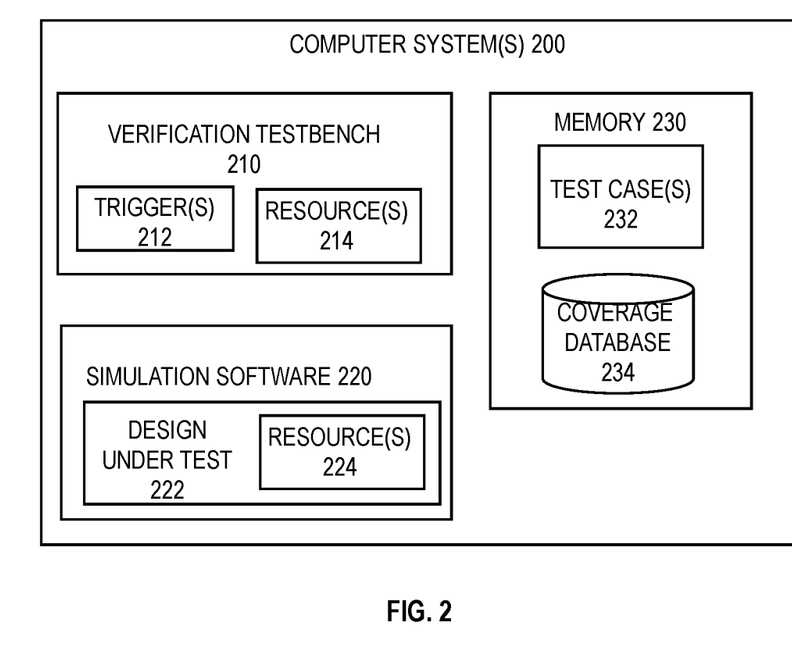
FIG. 2 is a block diagram of a system for dynamically controlling a coverage of a verification testbench simulation of a design-under-test (DUT) in accordance with one or more embodiments of the present invention.

FIG. 2 is a block diagram of a system 200 for dynamically controlling a coverage of a verification testbench simulation of a design-under-test in accordance with one or more embodiments of the present invention. FIG. 2 depicts a computers system 200 and elements of computer system 100, shown in FIG. 1, may be used in and/or integrated into computer system 200. The computer system 200 includes a verification testbench software 210 and simulation software 220 which are executed on one or more processors 101, as discussed in FIG. 1. The simulation software 220 is an application 230 that may include, be integrated with, and/or employ various types of software including but not limited to hardware description languages (HDLs) like System Verilog and VHDL to create high-level representations of a circuit, from which lower-level representations and ultimately actual wiring can be derived. HDL is a specialized computer language used to describe the structure and behavior of electronic circuits, and most commonly, digital logic circuits. A hardware description language enables a precise, formal description of an electronic circuit that allows for the automated analysis and simulation of an electronic circuit. The computer system 200 also includes a memory 230 that is configured to store the one or more test cases 232 and to store a coverage database 234.

In exemplary embodiments, the simulation software 220 is configured to simulate the execution of one or more test cases 232 by a design under test (DUT) 222. During simulation of the one or more test cases 232, by the simulation software 230, the verification testbench 210 monitors a plurality of resources 214, 224 and responsively records performance data in the coverage database 234. In exemplary embodiments, the verification testbench 210 includes a plurality of triggers 212 that is configured to selectively enable and disable the recording of the performance data in the coverage database 234. In addition, each trigger 212 includes a definition of a coverage for the trigger, i.e., which performance data from the design under test and the verification testbench to record and a frequency at which to record the performance data. For example, the coverage may specify to record a voltage of a given node once every 1 ms or once every 10 ms.

Figure 3:
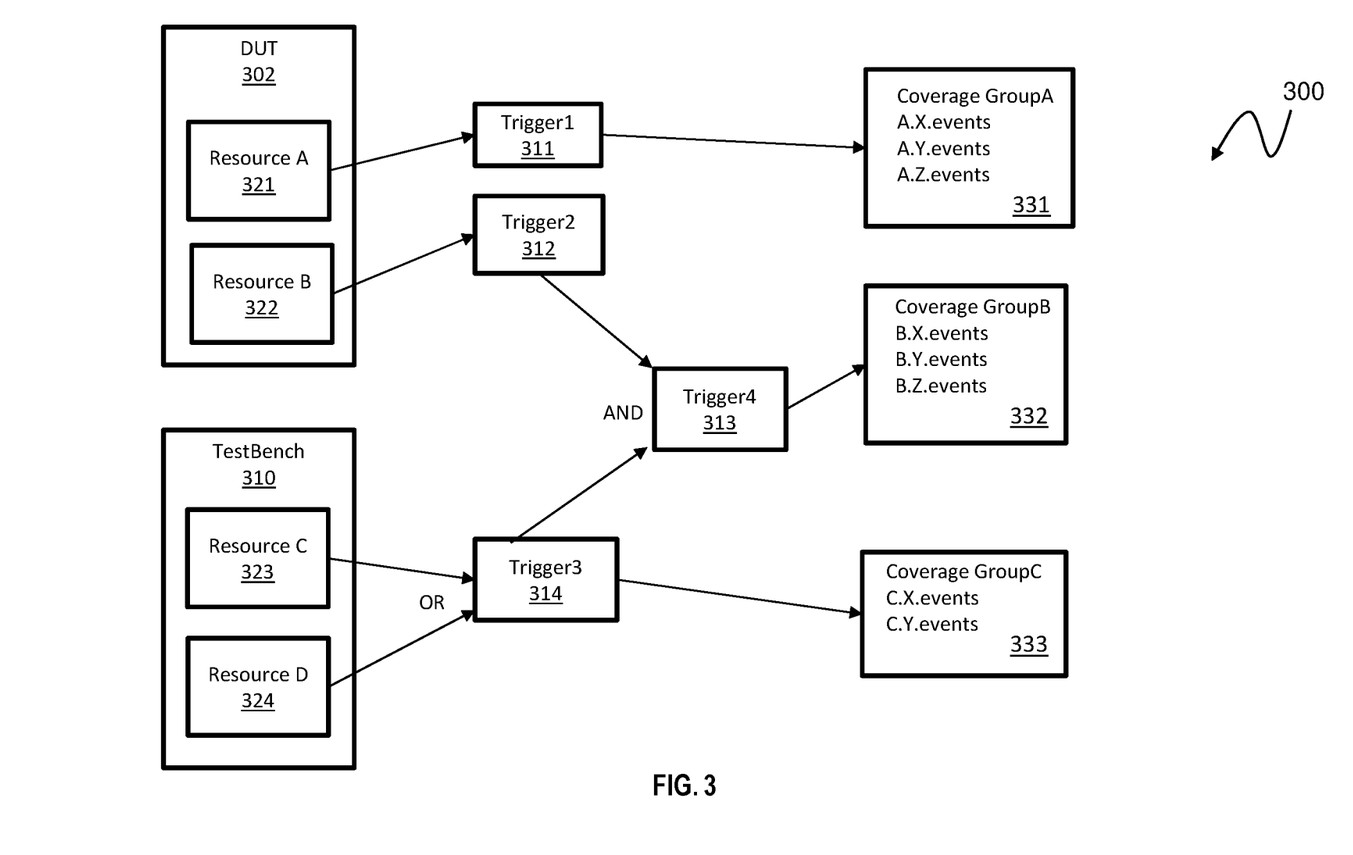
FIG. 3 is a block diagram illustrating an operation of a system for dynamically controlling a coverage of a verification testbench simulation of a design-under-test (DUT) in accordance with one or more embodiments of the present invention.

Referring now to FIG. 3 a block diagram illustrating the operation of a system 300 for dynamically controlling a coverage of a verification testbench simulation of a design-under-test (DUT) 302 in accordance with one or more embodiments of the present invention is shown. As illustrated, the system 300 includes a simulated DUT 302 that is executing one or more test cases. The DUT 302 includes resource A 321 and resource B 322, which are values/variables of the DUT 302 that are monitored during the simulation. The system 300 also includes a testbench 310, which includes resource C 323 and resource D 324 that are monitored during the simulation. As discussed above, the resources 321, 322, 323, and 324 can include, but are not limited to, a voltage, a clock, an initialization of a state of design, the occurrence of a particular activity, such as a boot, runtime, standby, etc.

The system 300 also includes a plurality of triggers 311, 312, 313, and 314. Each of the plurality of triggers is configured to monitor one or more of the resources 321, 322, 323, and 324 for the occurrence of an enable/disable condition, also referred to herein as an activation/deactivation condition. For example, trigger 1 311 monitors resource A 312 and trigger 3 314 monitors resources C 323 and resources D 324. A trigger that relies on a single resource is referred to as a low-level trigger and a trigger that relies on more than one resource is referred to as a high-level trigger. As illustrated, high-level triggers, such as trigger 4 313 and trigger 3 314, include one or more logical conditions that are used to determine whether to enable/disable the associated coverage. For example, trigger 3 314 includes an OR condition, indicating that coverage C 333 will be enabled upon either resource C 323 or resource D 324 meeting its associated enablement condition. Likewise, trigger 4 313 includes an AND condition, indicating that coverage B 332 will be enabled upon resource B 312 meeting its enablement condition and upon trigger 314 being met. In exemplary embodiments, when an enablement condition of a trigger is met, the coverage associated with the trigger is activated. For example, when trigger 1 311 identifies that resource A 321 has met the enablement condition specified in trigger 1 311, coverage A 331 is activated, and the A.X.events, A.Y.events, and A.Z.events specified in coverage A 211 are recorded in a coverage database until a disablement condition is identified by trigger 1 311.

Figure 4:
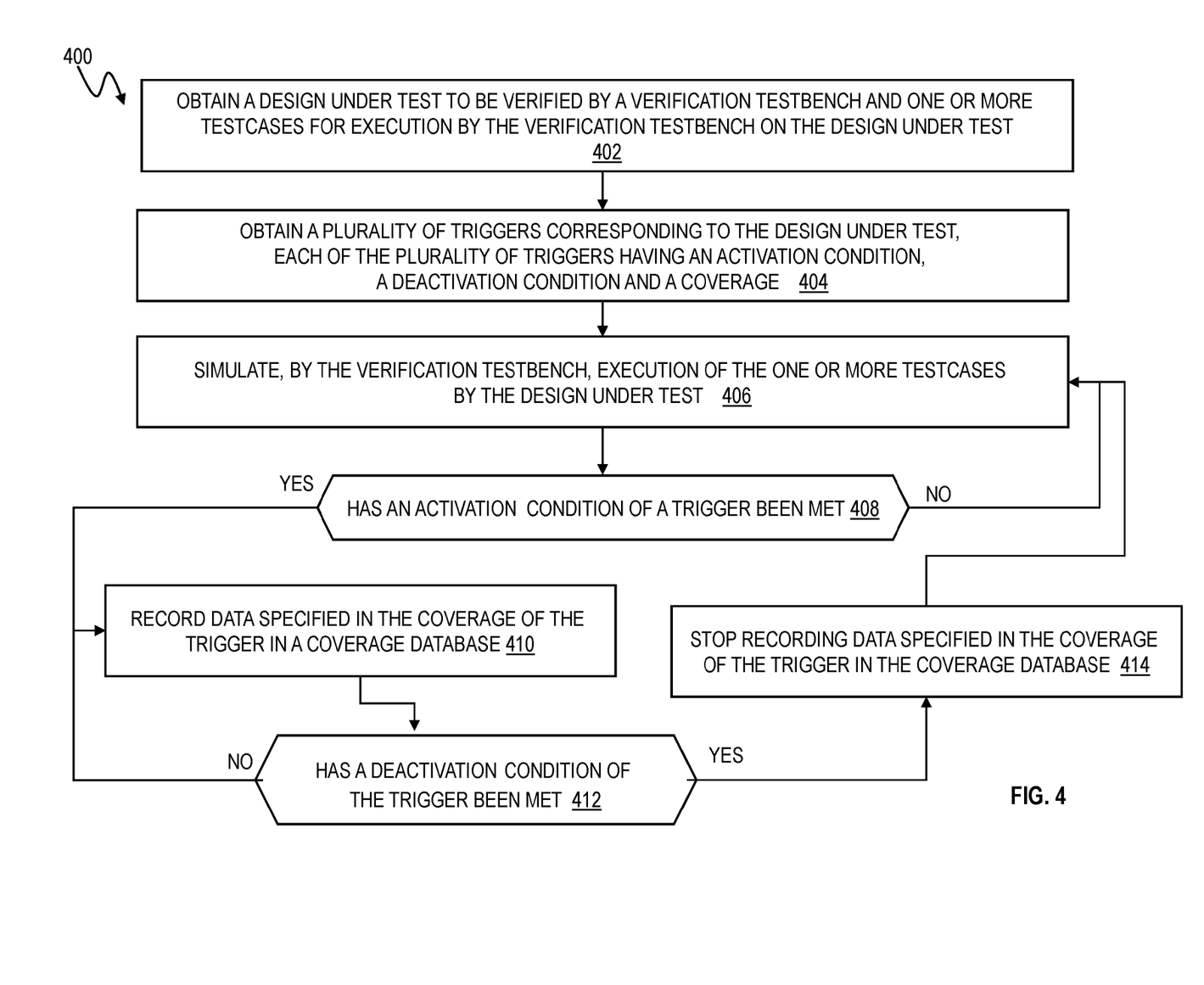
FIG. 4 is a flowchart of a method for dynamically controlling a coverage of a verification testbench simulation of a design-under-test (DUT) in accordance with one or more embodiments of the present invention.

Referring now to FIG. 4 is a flowchart of a method 400 for dynamically controlling a coverage of a verification testbench simulation of a design-under-test (DUT) in accordance with one or more embodiments of the present invention is shown. As shown at block 402, the method 400 includes obtaining a design under test to be verified by the verification testbench and one or more testcases for execution by the verification testbench on the design under test. Next, as shown at block 404, the method 400 includes obtaining a plurality of triggers corresponding to the design under test, wherein each of the plurality of triggers includes an activation condition, a deactivation condition, and a coverage. The method 400 also includes simulating, by the verification testbench, execution of the one or more testcases by the design under test, as shown at block 406.

Next, as shown at decision block 408, the method 400 includes determining if an activation condition of a trigger has been met. In one embodiment, the trigger is one of a low-level trigger and the activation condition includes a determination that a condition associated with a resource of one of the design under test and the verification testbench has been met. In another embodiment, the trigger is high-level trigger and the activation condition includes a determination that conditions associated with two or more resources of one of the design under test and the verification testbench have been met.

Based on determining that the activation condition of a trigger has been met, the method proceeds to block 410 and records data specified in the coverage of the trigger in a coverage database. If an activation condition of a trigger has not been met, the method returns to block 406 and continues with the simulation of the one or more test cases. As shown at decision block 412, the method 400 includes determining if a deactivation condition of a trigger has been met. If so, the method 400 proceeds to block 414 and stops recording the data specified in the coverage of the trigger in the coverage database. If a deactivation condition of a trigger has not been met, the method returns to block 410 and continues to record the recording the data specified in the coverage of the trigger in the coverage database.

In exemplary embodiments, the activation condition includes a determination that a value associated with a resource of one of the design under test and the verification testbench has reached a threshold level. For example, a voltage level of a node in the design under test has exceeded a threshold voltage, e.g. 5 V. In one embodiment, the deactivation condition includes a determination that the value associated with the resource of one of the design under test and the verification testbench has reached a second threshold level. Continuing with the above example, the deactivation condition can include determining that the voltage level of the node in the design under test has fallen below a second threshold value, e.g. 4V. In exemplary embodiments, the threshold values for the activation condition and the deactivation condition are the same, i.e., the first and second thresholds are both 5V. In some embodiments, particularly with high-level triggers, the activation condition and the deactivation conditions of a trigger rely on at least one different resource from one another. For example, the activation condition of a trigger may rely on a clock value and a voltage level, while the deactivation condition of the trigger only relies upon the voltage level.

In exemplary embodiments, technical effects and benefits of the methods, systems, and computer program products for dynamic control of coverage by a verification testbench include increasing the computational efficacy of the simulation of the design under test by reducing allowing the coverage to be dynamically controlled. In exemplary embodiments, dynamically controlling the coverage during the simulation of the design under test reduces the computing resources that are typically used with a statically defined coverage. In addition, by only recording the performance data when enabled by the triggers, the amount of data recorded in the coverage database is reduced. This reduction not only reduces the amount of data storage capacity required, but it also reduces the amount of performance data that will be analyzed to evaluate the performance of the design under test.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 5:
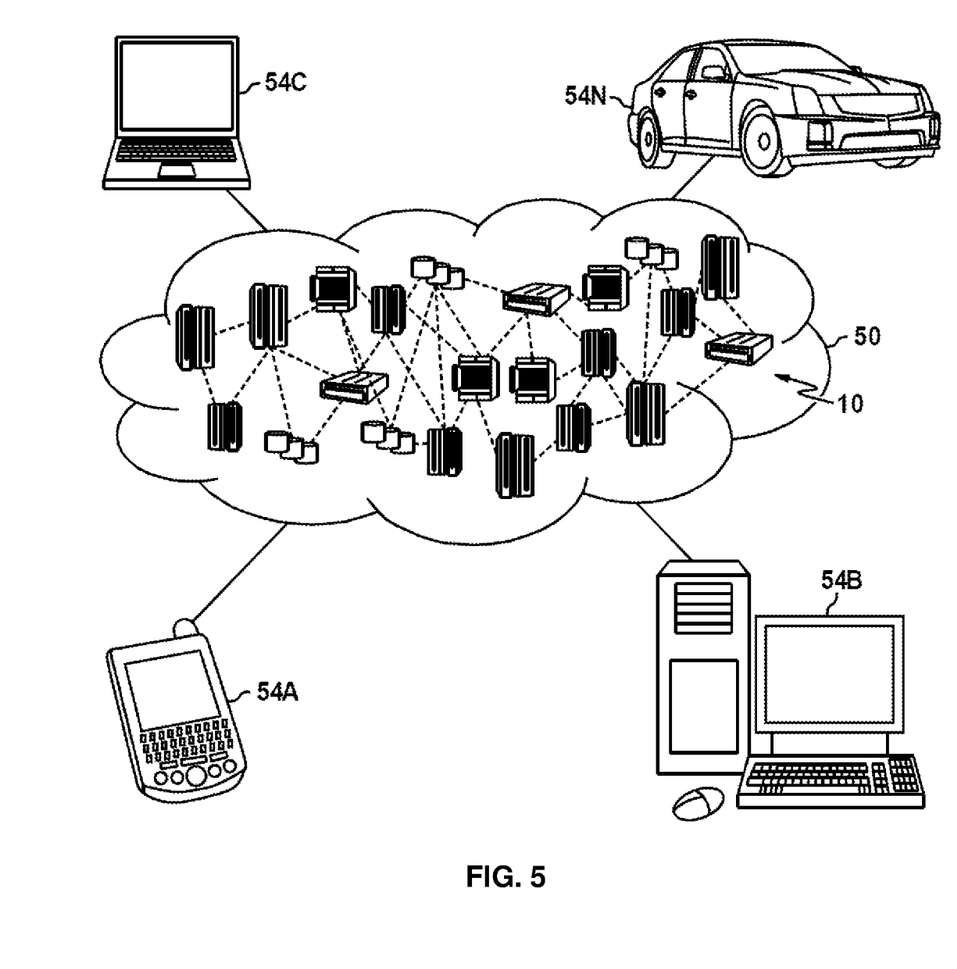
FIG. 5 depicts a cloud computing environment according to one or more embodiments of the present invention.

Referring now to FIG. 5, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described herein above, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 10 and cloud computing environment 50 can communicate with any type of computerized device over any type of network and/or network addressable connection (e.g., using a web browser).

Figure 6:
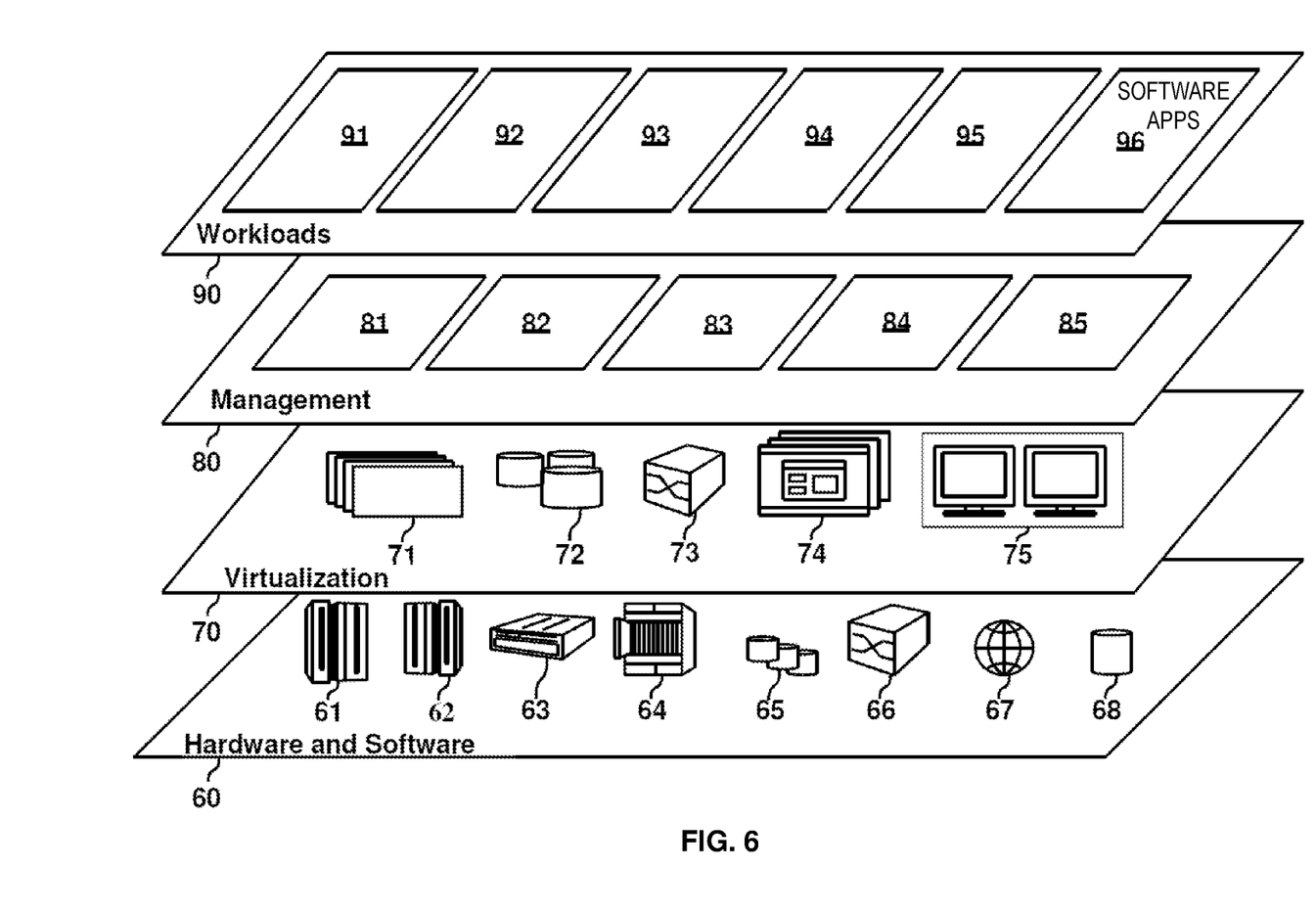
FIG. 6 depicts abstraction model layers according to one or more embodiments of the present invention.

Referring now to FIG. 6, a set of functional abstraction layers provided by cloud computing environment 50 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and dynamically controlling a coverage of a verification testbench simulation of a design-under-test 96. Also, software applications can function with and/or be integrated with Resource provisioning 81.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/ connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for dynamic control of coverage by a verification testbench, the method comprising:
   obtaining a design under test to be verified by the verification testbench;
   obtaining one or more testcases for execution by the verification testbench on the design under test;
   obtaining a plurality of triggers corresponding to the design under test, wherein each of the plurality of triggers includes an activation condition, a deactivation condition and a coverage;
   simulating, by the verification testbench, execution of the one or more testcases by the design under test; and
   based on detecting the activation condition of one of the plurality of triggers, recording, in a coverage database, data specified in the coverage corresponding the one of the plurality of triggers until the deactivation condition is detected.

2. The computer-implemented method of claim 1, wherein at least one of the plurality of triggers is a low-level trigger and the activation condition includes determination that a condition associated with a resource of one of the design under test and the verification testbench has been met.

3. The computer-implemented method of claim 2, wherein the condition associated with the resource is one of an initialization of an array, a start of a functional clock, and a performance of a scan clean command.

4. The computer-implemented method of claim 1, wherein at least one of the plurality of triggers is a high-level trigger and the activation condition includes determination that conditions associated with two or more resources of one of the design under test and the verification testbench have been met.

5. The computer-implemented method of claim 1, wherein the activation condition includes a determination that a value associated with a resource of one of the design under test and the verification testbench has reached a threshold level.

6. The computer-implemented method of claim 5, wherein the deactivation condition includes a determination that the value associated with the resource of one of the design under test and the verification testbench has reached a second threshold level.

7. The computer-implemented method of claim 5, wherein the resource is one of a clock value and a voltage level.

8. The computer-implemented method of claim 1, wherein the data specified in the coverage includes an identification of performance data from the design under test and the verification testbench to record and a frequency at which to record the performance data.

9. A system comprising:
   a memory having computer readable instructions; and
   one or more processors for executing the computer readable instructions, the computer readable instructions controlling the one or more processors to perform operations comprising:
      obtaining a design under test to be verified by the verification testbench;
      obtaining one or more testcases for execution by the verification testbench on the design under test;
      obtaining a plurality of triggers corresponding to the design under test, wherein each of the plurality of triggers includes an activation condition, a deactivation condition and a coverage;
      simulating, by the verification testbench, execution of the one or more testcases by the design under test; and
      based on detecting the activation condition of one of the plurality of triggers, recording, in a coverage database, data specified in the coverage corresponding the one of the plurality of triggers until the deactivation condition is detected.

10. The system of claim 9, wherein at least one of the plurality of triggers is a low-level trigger and the activation condition includes determination that a condition associated with a resource of one of the design under test and the verification testbench has been met.

11. The system of claim 10, wherein the condition associated with the resource is one of an initialization of an array, a start of a functional clock, and a performance of a scan clean command.

12. The system of claim 9, wherein at least one of the plurality of triggers is a high-level trigger and the activation condition includes determination that conditions associated with two or more resources of one of the design under test and the verification testbench have been met.

13. The system of claim 9, wherein the activation condition includes a determination that a value associated with a resource of one of the design under test and the verification testbench has reached a threshold level.

14. The system of claim 13, wherein the deactivation condition includes a determination that the value associated with the resource of one of the design under test and the verification testbench has reached a second threshold level.

15. The system of claim 14, wherein the resource is one of a clock value and a voltage level.

16. The system of claim 9, wherein the data specified in the coverage includes an identification of performance data from the design under test and the verification testbench to record and a frequency at which to record the performance data.

17. A computer program product comprising a computer readable storage medium having program instructions embodied therewith, the program instructions executable by a processor to cause the processor to perform operations comprising:
  obtaining a design under test to be verified by the verification testbench;
  obtaining one or more testcases for execution by the verification testbench on the design under test;
  obtaining a plurality of triggers corresponding to the design under test, wherein each of the plurality of triggers includes an activation condition, a deactivation condition and a coverage;
  simulating, by the verification testbench, execution of the one or more testcases by the design under test; and
  based on detecting the activation condition of one of the plurality of triggers, recording, in a coverage database, data specified in the coverage corresponding the one of the plurality of triggers until the deactivation condition is detected.

18. The computer program product of claim 17, wherein at least one of the plurality of triggers is a low-level trigger and the activation condition includes determination that a condition associated with a resource of one of the design under test and the verification testbench has been met.

19. The computer program product of claim 18, wherein the condition associated with the resource is one of an initialization of an array, a start of a functional clock, and a performance of a scan clean command.

20. The computer program product of claim 17, wherein at least one of the plurality of triggers is a high-level trigger and the activation condition includes determination that conditions associated with two or more resources of one of the design under test and the verification testbench have been met.

* * * * *